(12) United States Patent
Arai

(10) Patent No.: US 9,547,321 B2
(45) Date of Patent: Jan. 17, 2017

(54) TEMPERATURE SENSOR CIRCUIT AND INTEGRATED CIRCUIT

(71) Applicant: SOCIONEXT INC., Yokohama-shi, Kanagawa (JP)

(72) Inventor: Tomoyuki Arai, Kokubunji (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/941,151

(22) Filed: Nov. 13, 2015

(65) Prior Publication Data

US 2016/0187901 A1 Jun. 30, 2016

(30) Foreign Application Priority Data

Dec. 24, 2014 (JP) ................................. 2014-260847

(51) Int. Cl.
*G05F 1/46* (2006.01)
*H03K 17/687* (2006.01)

(52) U.S. Cl.
CPC ............ *G05F 1/463* (2013.01); *H03K 17/687* (2013.01)

(58) Field of Classification Search
CPC ....................................................... G05F 1/463
See application file for complete search history.

(56) References Cited

U.S. PATENT DOCUMENTS

| 5,357,149 A | 10/1994 | Kimura |
| 5,914,629 A | 6/1999 | Maki |
| 6,946,896 B2 * | 9/2005 | Behzad ................... G05F 3/262 327/512 |
| 7,417,487 B2 * | 8/2008 | Mori ................... H01L 27/0248 327/512 |
| 7,540,657 B2 * | 6/2009 | Mikuni ................... G01K 7/01 327/513 |

FOREIGN PATENT DOCUMENTS

| JP | 05-045233 A | 2/1993 |
| JP | 09-133587 A | 5/1997 |
| JP | 2006-258562 A | 9/2006 |

* cited by examiner

*Primary Examiner* — Jeffrey Zweizig
(74) *Attorney, Agent, or Firm* — Arent Fox LLP

(57) ABSTRACT

A temperature sensor circuit includes: an output circuit including a first field-effect transistor configured to output a current proportional to temperature when a voltage twice as high as a threshold voltage is applied to a gate of the first field-effect transistor; and a voltage generating circuit configured to generate the voltage twice as high as the threshold voltage by a plurality of field-effect transistors and supply the generated voltage twice as high as the threshold voltage to the gate of the first field-effect transistor.

21 Claims, 6 Drawing Sheets

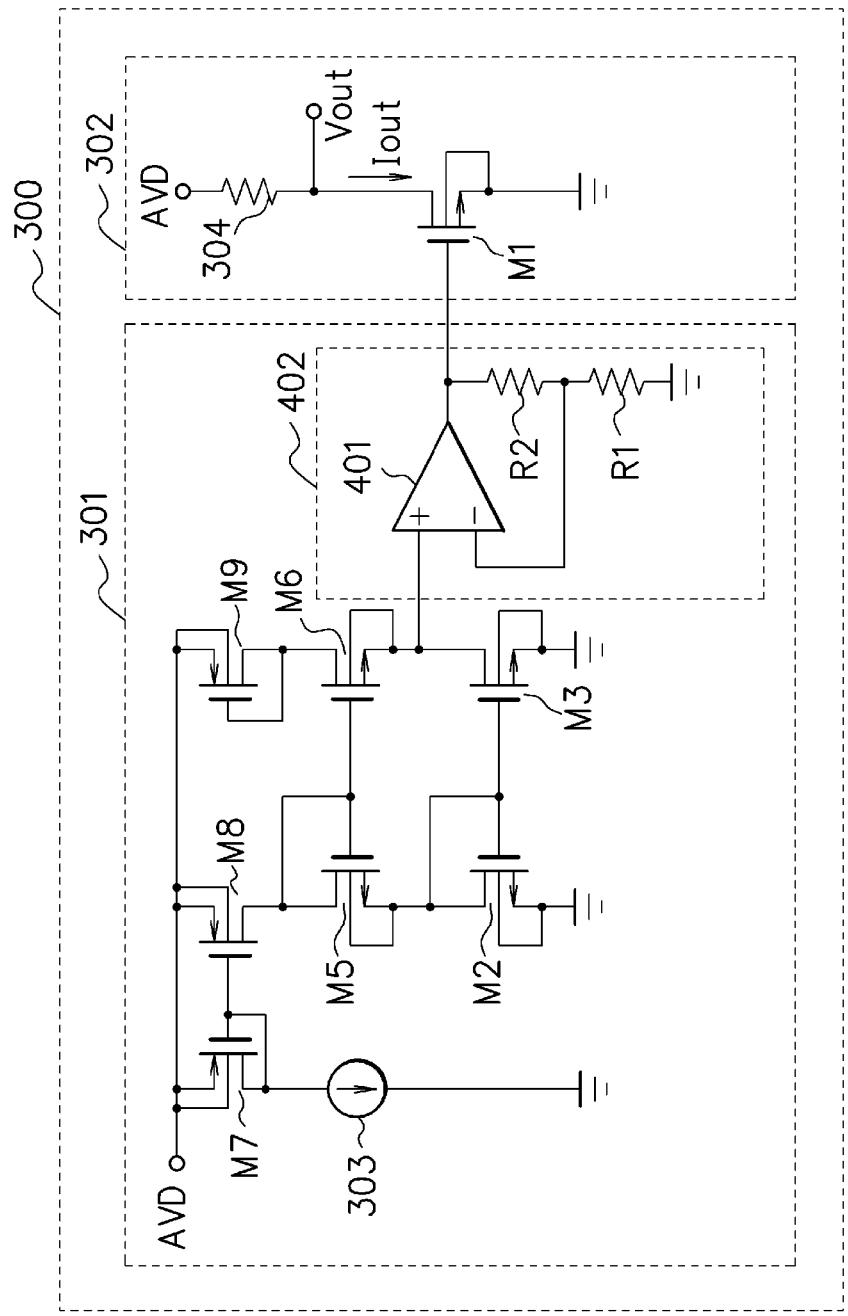
F I G. 4

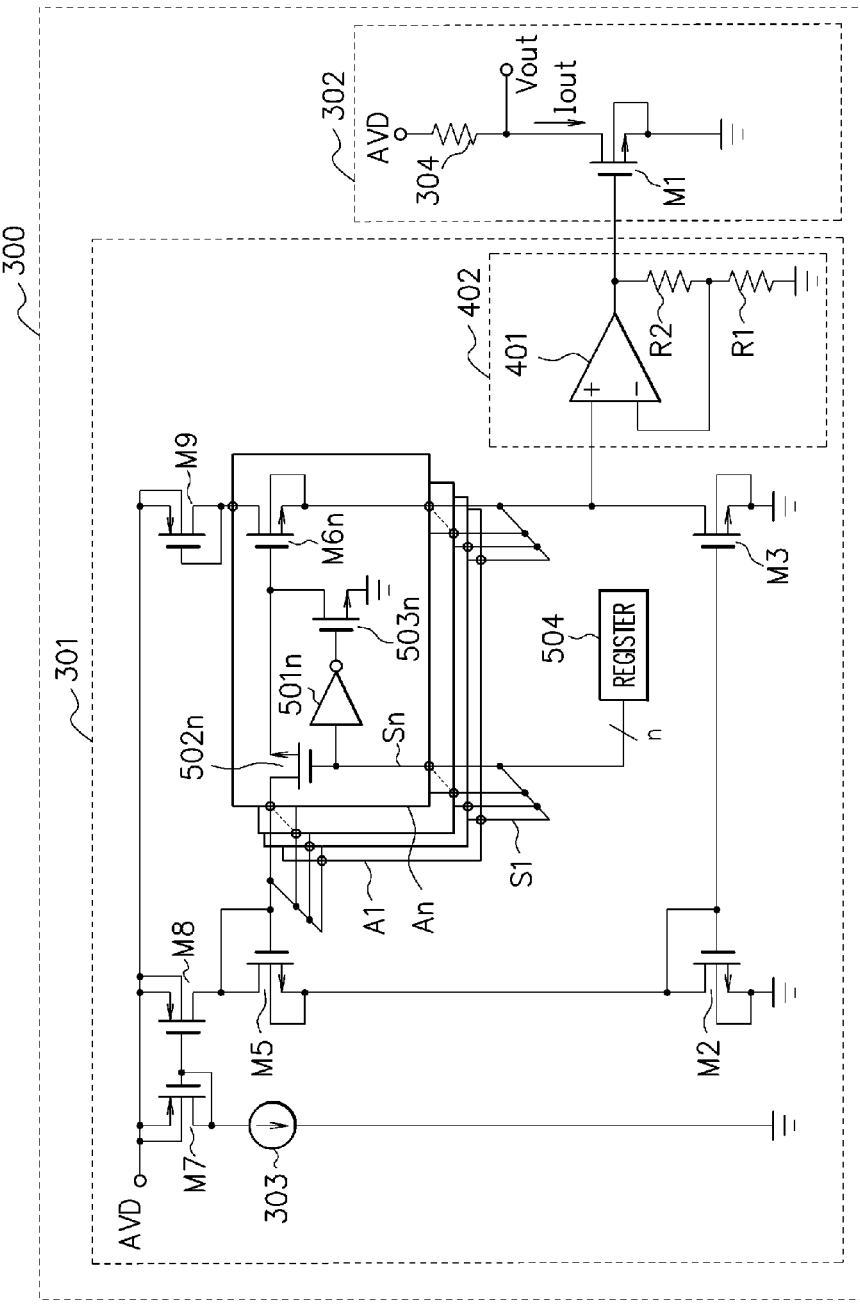
F I G. 5

TEMPERATURE SENSOR CIRCUIT AND INTEGRATED CIRCUIT

CROSS-REFERENCE TO RELATED APPLICATION

This application is based upon and claims the benefit of priority of the prior Japanese Patent Application No. 2014-260847, filed on Dec. 24, 2014, the entire contents of which are incorporated herein by reference.

FIELD

The embodiments discussed herein are directed to a temperature sensor circuit and an integrated circuit.

BACKGROUND

FIG. 1 is a circuit diagram illustrating a structure example of a temperature sensor circuit. The temperature sensor circuit generates a current I proportional to temperature by using a potential difference generated between collectors of two npn bipolar transistors 101 and 102 different in emitter size. However, in a CMOS process that does not allow the use of a triple well process, the npn bipolar transistors 101 and 102 cannot be used. Therefore, when the CMOS process is used, the temperature sensor circuit in FIG. 1 cannot be manufactured. Further, when the triple well process is used, it is necessary to separate wells, which has a problem of an increase of the area of the temperature sensor circuit.

FIG. 2 is a circuit diagram illustrating a structure example of another temperature sensor circuit. The temperature sensor circuit has MOS field-effect transistors 203 to 205 and pnp bipolar transistors 201, 202 and generates a current I proportional to temperature by using a potential difference generated between emitters of the two pnp bipolar transistors 201 and 202. Even when the CMOS process is used, the pnp bipolar transistors 201 and 202 can be used. However, using the pnp bipolar transistors 201 and 202 leads to a problem of an increase of the area.

Further, a temperature detecting device having a first MOS transistor and a second MOS transistor has been known (refer to Patent Document 1). A potential control circuit detects a potential under a gate of the first MOS transistor at the depletion time, and controls a gate voltage of the first MOS transistor based on the detected potential. A gate voltage of the second MOS transistor is controlled by the potential control circuit and an output of the second MOS transistor is a temperature output.

Patent Document 1: Japanese Laid-open Patent Publication No. 09-133587

Since the temperature sensor circuit in FIG. 1 uses the npn bipolar transistors 101 and 102, it is necessary to separate the wells when the CMOS process is used, which has a problem of the increase of the area. Further, the temperature sensor circuit in FIG. 2 has a problem of the increase of its area because of the use of the pnp bipolar transistors 201 and 202.

SUMMARY

A temperature sensor circuit includes: an output circuit including a first field-effect transistor configured to output a current proportional to temperature when a voltage twice as high as a threshold voltage is applied to a gate of the first field-effect transistor; and a voltage generating circuit configured to generate the voltage twice as high as the threshold voltage by a plurality of field-effect transistors and supply the generated voltage twice as high as the threshold voltage to the gate of the first field-effect transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a circuit diagram illustrating a structure example of a temperature sensor circuit according to a second embodiment;

FIG. 5 is a circuit diagram illustrating a structure example of a temperature sensor circuit according to a third embodiment;

DESCRIPTION OF EMBODIMENTS

First Embodiment

Figure 1:
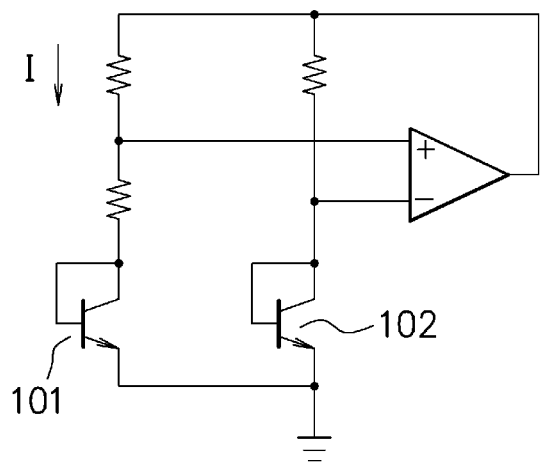
FIG. 1 is a circuit diagram illustrating a structure example of a temperature sensor circuit.
Figure 2:
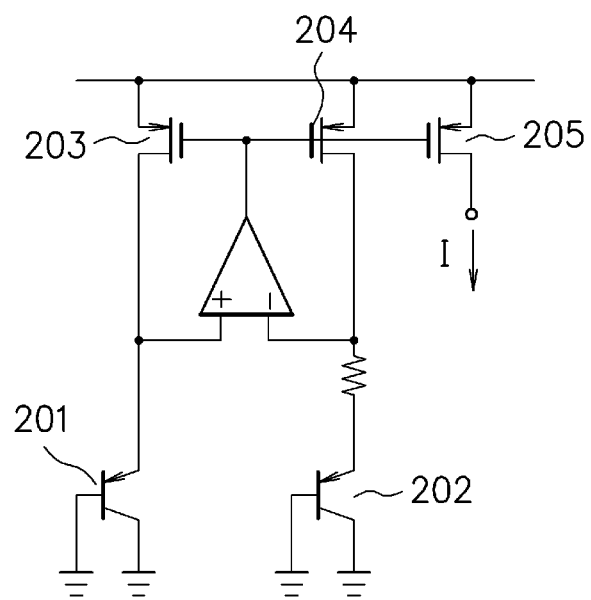
FIG. 2 is a circuit diagram illustrating a structure example of another temperature sensor circuit.
Figure 3:
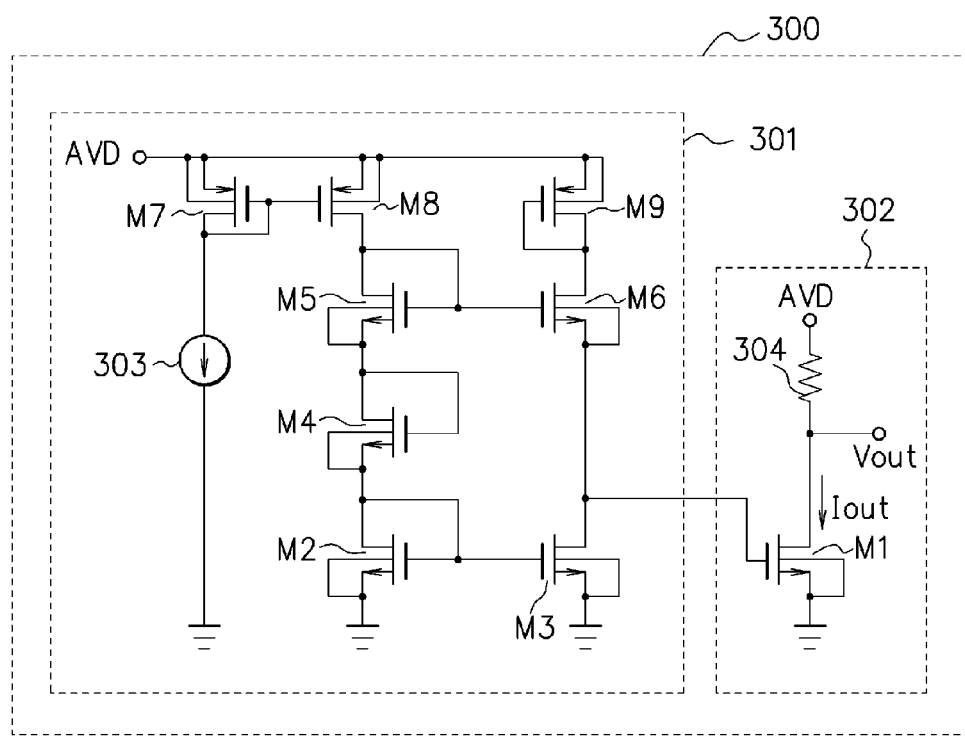
FIG. 3 is a circuit diagram illustrating a structure example of a temperature sensor circuit according to a first embodiment.

FIG. 3 is a circuit diagram illustrating a structure example of a temperature sensor circuit 300 according to a first embodiment. The temperature sensor circuit 300 has a voltage generating circuit 301 and an output circuit 302. The output circuit 302 has a first field-effect transistor M1 and a resistor 304. The voltage generating circuit 301 has a second field-effect transistor M2, a third field-effect transistor M3, a fourth field-effect transistor M4, a fifth field-effect transistor M5, a sixth field-effect transistor M6, a seventh field-effect transistor M7, an eighth field-effect transistor M8, a ninth field-effect transistor M9, and a current source 303. The first to sixth field-effect transistors M1 to M6 are n-channel field-effect transistors. The seventh to ninth field-effect transistors M7 to M9 are p-channel field-effect transistors. The first to ninth field-effect transistors M1 to M9 are MOS field-effect transistors. Since all the transistors in the temperature sensor circuit 300 are MOS field-effect transistors, the temperature sensor circuit 300 does not include any bipolar transistor. Therefore, the temperature sensor circuit 300 can be smaller in area as compared with the temperature sensor circuit in FIG. 1 using the npn bipolar transistors 101 and 102 and the temperature sensor circuit in FIG. 2 using the npn bipolar transistors 201 and 202.

The output circuit 302 includes the first field-effect transistor M1 which outputs a current Iout proportional to temperature when a voltage twice as high as a threshold voltage Vth is applied to its gate. The voltage generating circuit 301 generates the voltage twice as high as the threshold voltage Vth and supplies the generated voltage twice as high as the threshold voltage Vth to the gate of the first field-effect transistor M1. All the transistors in the voltage generating circuit 301 are field-effect transistors.

First, the structure of the voltage generating circuit 301 will be described. The second field-effect transistor M2 has a source and a back gate connected to a first potential node (ground potential node), and a gate and a drain connected to each other. The third field-effect transistor M3 has a source and a back gate connected to the first potential node (ground potential node), a gate connected to the gate of the second field-effect transistor M2, and a drain connected to the gate of the first field-effect transistor M1. The fourth field-effect transistor M4 has a source and a back gate connected to the drain of the second field-effect transistor M2, and a gate and a drain connected to each other. The fifth field-effect transistor M5 has a source and a back gate connected to the drain of the fourth field-effect transistor M4, and a gate and a drain connected to a drain (second potential node) of the eighth field-effect transistor M8. The sixth field-effect transistor M6 has a source and a back gate connected to the drain of the third field-effect transistor M3, a gate connected to the gate of the fifth field-effect transistor M5, and a drain connected to a drain (third potential node) of the ninth field-effect transistor M9. The seventh field-effect transistor M7 has a drain and a gate connected to the first potential node (ground potential node) via the current source 303, and a source and a back gate connected to a fourth potential node AVD. The eighth field-effect transistor M8 has the drain connected to the drain of the fifth field-effect transistor M5, a gate connected to the gate of the seventh field-effect transistor M7, and a source and a back gate connected to the fourth potential node AVD. The ninth field-effect transistor M9 has the drain and a gate connected to the drain of the sixth field-effect transistor M6, and a source and a back gate connected to the fourth potential node AVD.

The fourth potential node AVD is a positive potential node (power supply potential node). The drain of the eighth field-effect transistor M8 is also a positive potential node (second potential node), and the drain of the ninth field-effect transistor M9 is also a positive potential node (third potential node). Here, a ground potential is a 0 V potential, for instance, and a positive potential is a potential higher than the ground potential.

Next, the structure of the output circuit 302 will be described. The first field-effect transistor M1 has a source and a back gate connected to the first potential node (ground potential node), the gate connected to the drain of the third field-effect transistor M3, and a drain connected to an output voltage node Vout. The resistor 304 is connected between the fourth potential node AVD and the output voltage node Vout. The current Iout is a drain current of the first field-effect transistor M1 and is a current proportional to temperature as will be described later. A voltage of the output voltage node Vout is a voltage according to the current Iout proportional to temperature, and thus is a voltage proportional to temperature.

Next, a reason why the current Iout has a value proportional to temperature will be described. The threshold voltage Vth is a threshold voltage of the first to sixth field-effect transistors M1 to M6. $\Delta Vth/\Delta T$ is a constant value, where $\Delta T$ is a variation of temperature T and $\Delta Vth$ is a variation of the threshold voltage Vth.

Further, a parameter $\beta$ of the first field-effect transistor M1 is expressed by the following expression (1). Here, $\mu$ is mobility, Cox is a capacitance of a gate oxide film of the first field-effect transistor M1. Wg is a gate width of the first field-effect transistor M1. Lg is a gate length of the first field-effect transistor M1.

$$\beta = \mu \times Cox \times Wg/Lg \quad (1)$$

$(1/\beta) \times (\Delta\beta/\Delta T)$ becomes a constant value, where $\Delta\beta$ is a variation of the parameter $\beta$ relative to the variation $\Delta T$ of the temperature T.

Further, a drain current Ids of the first field-effect transistor M1 is expressed by the following expression (2). Here, Vgs is a gate-to-source voltage of the first field-effect transistor M1.

$$Ids = \beta \times (Vgs - Vth)^2 / 2 \quad (2)$$

Here, the voltage 2×Vth twice as high as the threshold voltage Vth is applied as the gate-to-source voltage Vgs as expressed by the following expression (3).

$$Vgs = 2 \times Vth \quad (3)$$

When the expression (3) is substituted in the expression (2), the following expression (4) holds.

$$Ids = \beta \times (2 \times Vth - Vth)^2 / 2 \quad (4)$$
$$= \beta \times (Vth)^2 / 2$$

When the drain current Ids of the expression (4) is partially differentiated by the temperature T, the following expression (5) holds.

$$\partial Ids/\partial T = \{(Vth)^2/2\} \times (\partial\beta/\partial T) + \beta \times Vth \times (\partial Vth/\partial T) \quad (5)$$

When the expression (5) is divided by the expression (4), the following expression (6) holds.

$$\partial Ids/Ids = \{(1/\beta) \times (\partial\beta/\partial T) + (2/Vth) \times (\partial Vth/\partial T)\}\partial T \quad (6)$$

As described above, $\Delta Vth/\Delta T$ is a constant value, and $(1/\beta) \times (\Delta\beta/\Delta T)$ is a constant value. Therefore, it is understood that the drain current Ids is proportional to the temperature T because the term in { } in the expression (6) is a constant. The drain current Ids of the first field-effect transistor M1 is the current Iout in FIG. 3. Therefore, it is understood that, by applying the voltage 2×Vth twice as high as the threshold voltage Vth as the gate-to-source voltage Vgs of the first field-effect transistor M1 as in the above expression (3), the current Iout becomes a current proportional to the temperature T.

Next, a method for the voltage generating circuit 301 to supply the voltage 2×Vth twice as high as the threshold value Vth to the gate of the first field-effect transistor M1 will be described. A gate length of the first field-effect transistor M1 is represented by Lg1, and a gate width of the first field-effect transistor M1 is represented by Wg1. A gate length of the second field-effect transistor M2 is represented by Lg2, and a gate width of the second field-effect transistor M2 is represented by Wg2. A gate length of the third field-effect transistor M3 is represented by Lg3, and a gate width of the third field-effect transistor M3 is represented by Wg3. A gate length of the fourth field-effect transistor M4 is represented by Lg4, and a gate width of the fourth field-effect transistor M4 is represented by Wg4. A gate length of the fifth field-effect transistor M5 is represented by Lg5, and a gate width of the fifth field-effect transistor M5 is represented by Wg5. A gate length of the sixth field-effect transistor M6 is represented by Lg6, and a gate width of the sixth field-effect transistor M6 is represented by Wg6.

The gate lengths Lg1 to Lg6 are all equal as expressed by the following expression (7). Further, the gate widths Wg2 to Wg6 have the relation of the following expression (8).

$$Lg1 = Lg2 = Lg3 = Lg4 = Lg5 = Lg6 \quad (7)$$

$$Wg2 \times m = Wg4 \times m = Wg5 \times m = Wg3 = Wg6/9 \qquad (8)$$

Further, a gate length of the seventh field-effect transistor M7 is represented by Lg7, and a gate width of the seventh field-effect transistor M7 is represented by Wg7. A gate length of the eighth field-effect transistor M8 is represented by Lg8, and a gate width of the eighth field-effect transistor M8 is represented by Wg8. A gate length of the ninth field-effect transistor M9 is represented by Lg9, and a gate width of the ninth field-effect transistor M9 is represented by Wg9.

The gate lengths Lg7 to Lg9 have the relation of the following expression (9). Further, the gate widths Wg7 to Wg9 have the relation of the following expression (10).

$$Lg2 < Lg7 = Lg8 = Lg9 \qquad (9)$$

$$Wg7 = Wg8 \times n = Wg9 \times m \times n \qquad (10)$$

Here, a voltage Vod is defined as Vod=(Vgs−Vth). Vgs is a gate-to-source voltage. A gate-to-source voltage Vgs2 of the second field-effect transistor M2 is expressed by the following expression (11).

$$Vgs2 = Vth + Vod \qquad (11)$$

Similarly, a gate-to-source voltage Vgs4 of the fourth field-effect transistor M4 is expressed by the following expression (12).

$$Vgs4 = Vth + Vod \qquad (12)$$

Similarly, a gate-to-source voltage Vgs5 of the fifth field-effect transistor M5 is expressed by the following expression (13).

$$Vgs5 = Vth + Vod \qquad (13)$$

As for a drain current Ids5 of the fifth field-effect transistor M5, the following expression (14) holds similarly to the expression (2). Here, a parameter β5 is a parameter β of the fifth field-effect transistor M5.

$$Ids5 = \beta 5 \times (Vgs5 - Vth)^2/2 \qquad (14)$$

Similarly, as for a drain current Ids6 of the sixth field-effect transistor M6, the following expression (15) holds. Here, a parameter β6 is a parameter β of the sixth field-effect transistor M6.

$$Ids6 = \beta 6 \times (Vgs6 - Vth)^2/2 \qquad (15)$$

Since Wg2×m=Wg3 according to the above expression (8), the drain current Ids6 becomes m times the drain current Ids5 as expressed by the following expression (16). Here, a drain current Ids2 is a drain current of the second field-effect transistor M2, and a drain current Ids3 is a drain current of the third field-effect transistor M3.

$$Ids2 \times m = Ids3$$

$$Ids2 = Ids5$$

$$Ids3 = Ids6$$

$$Ids6 = Ids5 \times m \qquad (16)$$

Since Wg5×m=Wg6/9 according to the above expression (8), it follows from the above expressions (14) to (16) that the following expression (17) holds.

$$\beta 6 = 9 \times \beta 5 \qquad (17)$$
$$= 3^2 \times \beta 5$$

From the above expressions (14) to (17), it follows that the following expression (18) holds as for a gate-to-source voltage Vgs6 of the sixth field-effect transistor M6.

$$Vgs6 = Vth + 3 \times Vod \qquad (18)$$

A gate voltage Vg5 is a voltage from the gate of the field-effect transistor M5 to the ground potential node and is expressed by the following expression (19).

$$Vg5 = Vgs5 + Vgs4 + Vgs2 \qquad (19)$$
$$= (Vth + Vod) + (Vth + Vod) + (Vth + Vod)$$
$$= 3 \times (Vth + Vod)$$

Therefore, a gate voltage Vg1 of the first field-effect transistor M1 is expressed by the following expression (20).

$$Vg1 = Vg5 - Vgs6 \qquad (20)$$
$$= 3 \times (Vth + Vod) - (Vth + 3 \times Vod)$$
$$= 2 \times Vth$$

As is understood from the above, the voltage generating circuit 301 is capable of supplying the voltage 2×Vth twice as high as the threshold voltage Vth to the gate of the first field-effect transistor M1. When the gate voltage Vg1 of the first field-effector transistor M1 becomes the voltage 2×Vth, the current Iout flowing in the first field-effect transistor M1 becomes a current proportional to temperature as described above. According to this embodiment, since all the transistors in the temperature sensor circuit 300 are field-effect transistors, it is possible to reduce the area of the temperature sensor circuit 300.

Second Embodiment

FIG. 4 is a circuit diagram illustrating a structure example of a temperature sensor circuit 300 according to a second embodiment. As compared with the temperature sensor circuit 300 in FIG. 3, the temperature sensor circuit 300 in FIG. 4 does not have the fourth field-effect transistor M4 and an amplifier circuit 402 is added. Hereinafter, differences of this embodiment (FIG. 4) from the first embodiment (FIG. 3) will be described.

A second field-effect transistor M2 has a drain and a gate connected to a source and a back gate of a fifth field-effect transistor M5. A sixth field-effect transistor M6 has a source connected to an input node of the amplifier circuit 402. The amplifier circuit 402 has an output node connected to a gate of a first field-effect transistor M1. The amplifier circuit 402 has an operational amplifier 401 and resistors R1, R2. The operational amplifier 401 has a non-inverting input terminal connected to the source of the sixth field-effect transistor M6. The resistor R1 is connected between the non-inverting input terminal of the operational amplifier 401 and a first potential node (ground potential node). The resistor R2 is connected between an output terminal and the non-inverting input terminal of the operational amplifier 401. The output terminal of the operational amplifier 401 is connected to the gate of the first field-effect transistor M1.

Gate lengths Lg1 to Lg3, Lg5, Lg6 are all equal as expressed by the following expression (21). Further, gate widths Wg2, Wg3, Wg5, Wg6 have the relation of the following expression (22).

$$Lg1 = Lg2 = Lg3 = Lg5 = Lg6 \quad (21)$$

$$Wg2 \times m = Wg5 \times m = Wg3 = Wg6/4 \quad (22)$$

According to the above expression (22), Wg5×m=Wg6/4 and therefore, it follows from the above expressions (14) to (16) that the following expression (23) holds.

$$\begin{aligned} \beta 6 &= 4 \times \beta 5 \\ &= 2^2 \times \beta 5 \end{aligned} \quad (23)$$

From the above expressions (14) to (16), (23), it follows that the following expression (24) holds as for a gate-to-source voltage Vgs6 of the sixth field-effect transistor M6.

$$Vgs6 = Vth + 2 \times Vod \quad (24)$$

A gate voltage Vg5 is a voltage from a gate of the field-effect transistor M5 to the ground potential node and is expressed by the following expression (25).

$$\begin{aligned} Vg5 &= Vgs5 + Vgs2 \\ &= (Vth + Vod) + (Vth + Vod) \\ &= 2 \times (Vth + Vod) \end{aligned} \quad (25)$$

Therefore, a source voltage Vs6 of the sixth field-effect transistor M6 is expressed by the following expression (26).

$$\begin{aligned} Vs6 &= Vg5 - Vgs6 \\ &= 2 \times (Vth + Vod) - (Vth + 2 \times Vod) \\ &= Vth \end{aligned} \quad (26)$$

The resistors R1 and R2 have the relation of R2=2×R1. The amplifier circuit 402 amplifies the source voltage Vs6 (=Vth) by an amplification factor R2/R1 (=2), and outputs a voltage 2×Vth to the gate of the first field-effect transistor M1. That is, the amplifier circuit 402 supplies the voltage 2×Vth twice as high as the source voltage Vs6 (=Vth) of the sixth field-effect transistor M6 to the gate of the first field-effect transistor M1.

As is understood from the above, a voltage generating circuit 301 is capable of supplying the voltage 2×Vth twice as high as the threshold voltage Vth to the gate of the first field-effect transistor M1. When a gate voltage Vg1 of the first field-effect transistor M1 becomes the voltage 2×Vth, a current Iout flowing in the first field-effect transistor M1 becomes a current proportional to temperature as described above. According to this embodiment, since the transistors in the temperature sensor circuit 300 are all field-effect transistors, it is possible to reduce the area of the temperature sensor circuit 300.

Further, in the first embodiment (FIG. 3), the four field-effect transistors M2, M4, M5, M8 are connected in series between the first potential node (ground potential node) and the fourth potential node AVD. In this embodiment (FIG. 4), on the other hand, the three field-effect transistors M2, M5, M8 are connected in series between a first potential node (ground potential node) and a fourth potential node AVD. Therefore, in this embodiment, a power supply voltage applied to the fourth potential node AVD can be lower than that in the first embodiment. That is, the temperature sensor circuit 300 of this embodiment is capable of operating with a low power supply voltage as compared with the temperature sensor circuit 300 of the first embodiment.

Third Embodiment

FIG. 5 is a circuit diagram illustrating a structure example of a temperature sensor circuit 300 according to a third embodiment. As compared with the temperature sensor circuit 300 in FIG. 4, the temperature sensor circuit 300 in FIG. 5 is provided with n pieces of circuits A1 to An and a register 504 instead of the sixth field-effect transistor M6. Hereinafter, differences of this embodiment (FIG. 5) from the second embodiment (FIG. 4) will be described.

The n pieces of circuits A1 to An are circuits for adjusting a gate width Wg6 of the sixth field-effect transistor M6 in FIG. 4, and are connected in parallel between a drain of a third field-effect transistor M3 and a drain of a ninth field-effect transistor M9. The resistor 504 outputs n-bit control signals S1 to Sn to the n pieces of circuits A1 to An respectively.

The circuit An has an inverter 501*n* and re-channel field-effect transistors 502*n*, 503*n* in addition to an element transistor M6*n* which becomes a constituent element of the sixth field-effect transistor M6. The element transistor M6*n* is a field-effect transistor. The inverter 501*n* outputs a logic inverted signal of the control signal Sn. The n-channel field-effect transistor 502*n* has a gate connected to a line of the control signal Sn, and a drain connected to a gate of a fifth field-effect transistor M5. The n-channel field-effect transistor 503*n* has a gate connected to an output terminal of the inverter 501*n*, a source connected to a first potential node (ground potential node), and a drain connected to a gate of the element transistor M6*n* of the sixth field-effect transistor. The element transistor M6*n* of the sixth field-effect transistor corresponds to the sixth-field-effect transistor M6 in FIG. 4, and has a source and a back gate connected to the drain of the third field-effect transistor M3, the gate connected to a source of the n-channel field-effect transistor 502*n*, and a drain connected to a source and a gate of the ninth field-effect transistor M9.

When the control signal Sn has a high level, the n-channel field-effect transistor 502*n* turns on, and the n-channel field-effect transistor 503*n* turns off. As a result, in the element transistor M6*n* of the sixth field-effect transistor, the source and the back gate are connected to the drain of the third field-effect transistor M3, the gate is connected to the gate and a drain of the fifth field-effect transistor M5, and the drain is connected to the source and the gate of the ninth field-effect transistor M9, as in the sixth field-effect transistor M6 in FIG. 4.

On the other hand, when the control signal Sn has a low level, the n-channel field-effect transistor 502*n* turns off, and the n-channel field-effect transistor 503*n* turns on. As a result, the element transistor M6*n* of the sixth field-effect transistor turns off to be disconnected from the third field-effect transistor M3 and the ninth field-effect transistor M9.

Similarly to the circuit An, the circuit A1 receives the control signal S1, and has an inverter 501 1 and n-channel field-effect transistors 502 1, 503 1 in addition to an element transistor M61 of the sixth field-effect transistor. The element transistor M61 is a field-effect transistor. When the control signal S1 has a high level, in the element transistor M61 of the sixth field-effect transistor, a source and a back gate are connected to the drain of the third field-effect transistor M3, a gate is connected to the gate and the drain of the fifth field-effect transistor M5, and a drain is connected to the source and the gate of the ninth field-effect transistor M9, as in the sixth-field-effect transistor M6 in FIG. 4. On the other hand, when the control signal S1 has a low level, the element transistor M61 of the sixth field-effect transistor turns off to be disconnected from the third field-effect transistor M3 and the ninth field-effect transistor M9.

The n pieces of circuits A1 to An, which have the same structure, receive the control signals S1 to Sn respectively, and have the inverters 5011 to 501n and the n-channel field-effect transistors 5021 to 502n, 5031 to 503n in addition to the element transistors M61 to M6n of the sixth field-effect transistor.

According to the n-bit control signals S1 to Sn, the connection/disconnection of the n pieces of element transistors M61 to M6n of the sixth field-effect transistor is controlled, so that the number of element transistors, out of the element transistors M61 to M6n of the sixth field-effect transistor, that are connected in parallel is controlled. Gate widths of the n pieces of element transistors (field-effect transistors) M61 to M6n are set to values equal to two raised to different powers, for instance. Out of the element transistors M61 to M6n of the sixth field-effect transistor, that in the connection state corresponds to the sixth field-effect transistor M6 in FIG. 4. Therefore, in the temperature sensor circuit 300, a gate width Wg6 of the sixth field-effect transistor M6 is changeable according to the control signals S1 to Sn.

The gate width Wg6 of the sixth field-effect transistor M6 is set so that Wg2×m=Wg5×m=Wg3=Wg6/4 is satisfied as expressed by the above expression (22), so that a gate voltage of a first field-effect transistor M1 becomes 2×Vth. However, a value of the gate width Wg6 of the sixth field-effect transistor M6 sometimes deviates from the set value due to a process variation, an environmental change, or the like. In this case, by changing the values of the control signals S1 to Sn stored in the register 504, it is possible to adjust the gate width Wg6 of the sixth field-effect transistor M6 so that the relation of the above expression (22) is satisfied. Consequently, the gate voltage of the first field-effect transistor M1 becomes 2×Vth, and a current Iout becomes a current proportional to temperature.

Fourth Embodiment

Figure 6:
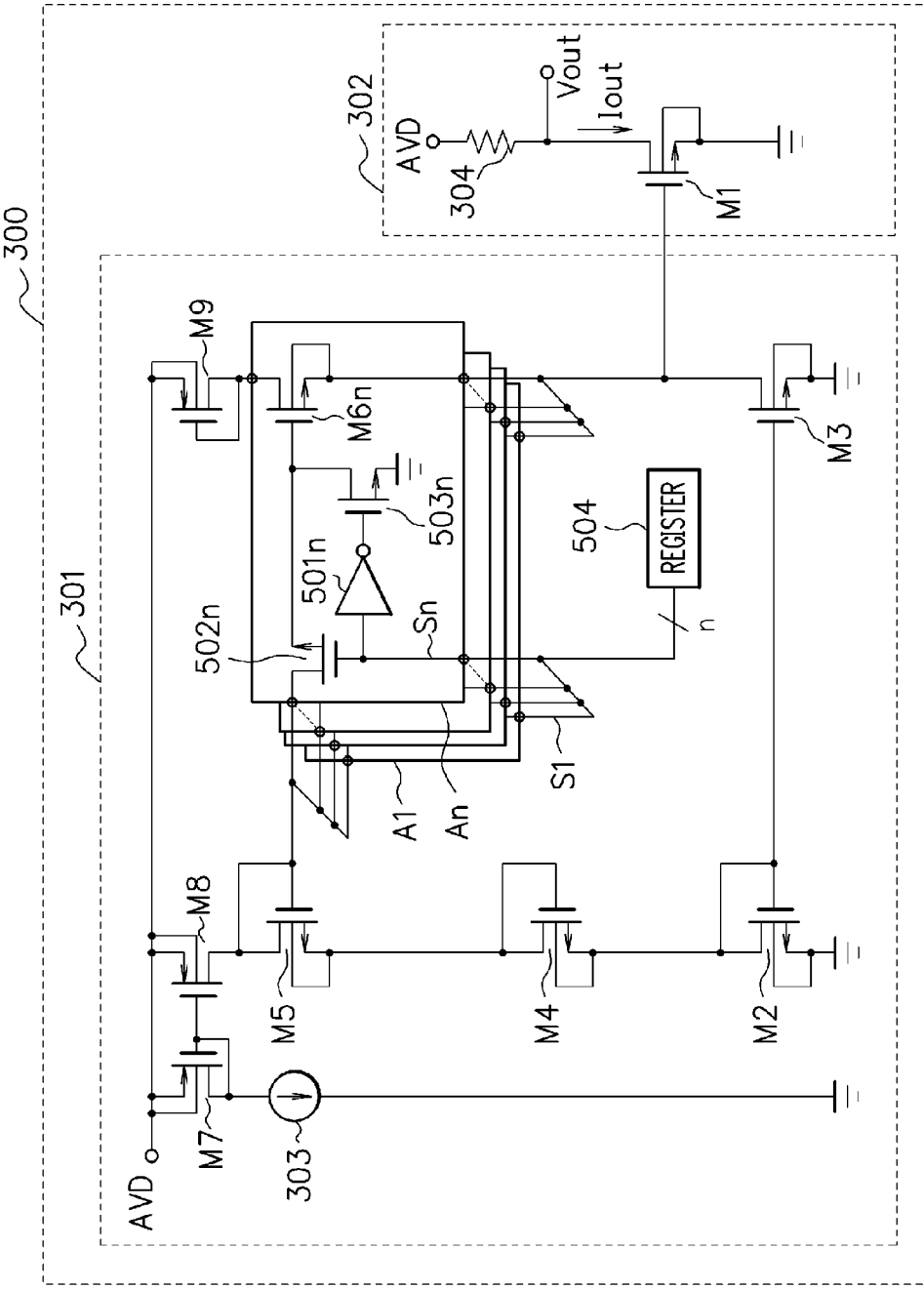
FIG. 6 is a circuit diagram illustrating a structure example of a temperature sensor circuit according to a fourth embodiment.

FIG. 6 is a circuit diagram illustrating a structure example of a temperature sensor circuit 300 according to a fourth embodiment. As compared with the temperature sensor circuit 300 in FIG. 3, the temperature sensor circuit 300 in FIG. 6 is provided with n pieces of circuits A1 to An and a register 504 instead of the sixth field-effect transistor M6. Hereinafter, differences of this embodiment from the first embodiment will be described. The n pieces of circuits A1 to An and the register 504 are the same as those in FIG. 5. In the temperature sensor circuit 300 of this embodiment, it is possible to change a gate width Wg6 of the sixth field-effect transistor M6 of the first embodiment, according to control signals S1 to Sn as in the third embodiment.

The gate width Wg6 of the sixth field-effect transistor M6 is set so that Wg2×m=Wg4×m=Wg5×m=Wg3=Wg6/9 is satisfied as expressed by the above expression (8), and consequently, a gate voltage of a first field-effect transistor M1 becomes 2×Vth. By changing values of the control signals S1 to Sn stored in the register 504, it is possible to adjust the gate width Wg6 of the sixth field-effect transistor M6 so that the relation of the above expression (8) is satisfied. Consequently, the gate voltage of the first field-effect transistor M1 becomes 2×Vth, and a current Iout becomes a current proportional to temperature.

Fifth Embodiment

Figure 7:
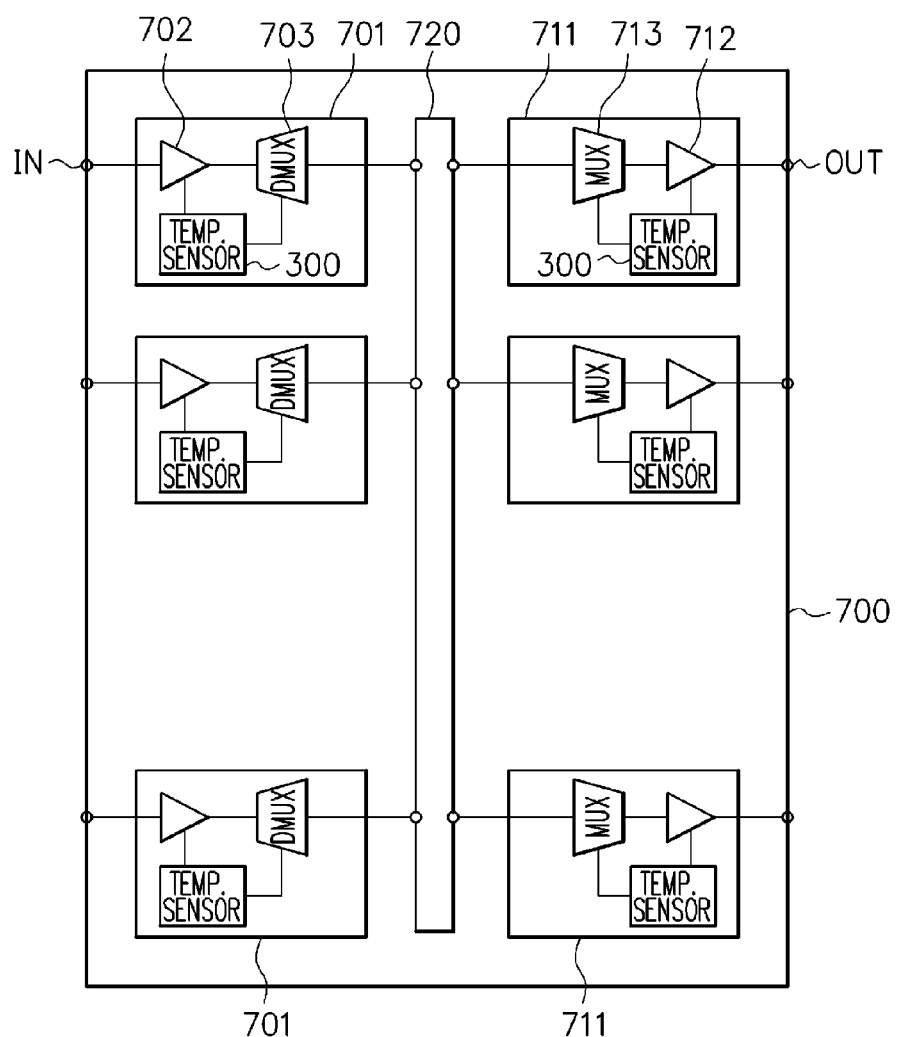
FIG. 7 is a diagram illustrating a structure example of an integrated circuit according to a fifth embodiment.

FIG. 7 is a diagram illustrating a structure example of an integrated circuit according to a fifth embodiment. The integrated circuit 700 has n pieces of receiving circuits 701 and n pieces of transmitting circuits 711 corresponding to n pieces of lanes. A digital circuit 720 is connected between the n pieces of receiving circuits 701 and the n pieces of transmitting circuits 711.

The receiving circuits 701 each have a temperature sensor circuit 300, an equalizer 702, and a demultiplexer 703. The equalizer 702 applies equalization processing to a serial signal received via an input terminal IN. The demultiplexer 703 is a serial-parallel converter and converts the serial signal output by the equalizer 702 to a parallel signal. The digital circuit 720 digitally processes the parallel signal output by the demultiplexer 703. The temperature sensor circuit 300 is any of the temperature sensor circuits 300 of the first to fourth embodiments, and outputs a voltage that is based on a current Iout proportional to temperature to the equalizer 702 and the demultiplexer 703. The equalizer 702 and the demultiplexer 703 are processing circuits and perform processing according to the voltage that is based on the current Iout which voltage is output by the temperature sensor circuit 300. Specifically, the equalizer 702 and the demultiplexer 703 control a bias point according to the voltage that is based on the current Iout.

The transmitting circuits 711 each have a temperature sensor circuit 300, an amplifier 712, and a multiplexer 713. The multiplexer 713 is a parallel-serial converter and converts a parallel signal output by the digital circuit 720 to a serial signal. The amplifier 712 amplifies the serial signal output by the multiplexer 713 and transmits the amplified serial signal via an output terminal OUT. The temperature sensor circuit 300 is any of the temperature sensor circuits 300 of the first to fourth embodiments and outputs a voltage that is based on a current Iout proportional to temperature to the amplifier 712 and the multiplexer 713. The amplifier 712 and the multiplexer 713 are processing circuits and perform processing according to the voltage that is based on the current Iout which voltage is output by the temperature sensor circuit 300. Specifically, the amplifier 712 and the multiplexer 713 control a bias point according to the voltage that is based on the current Iout.

In the integrated circuit 700, a temperature gradient is generated according to power consumption. The temperature sensor circuit 300 small in area and low in power consumption is provided in each of the n pieces of receiving circuits 701 and the n pieces of transmitting circuits 711. The n pieces of receiving circuits 701 each are capable of detecting a local temperature by the temperature sensor circuit 300, compensating properties of the equalizer 702 and the demultiplexer 703, and contributing to a power consumption reduction. Similarly, the n pieces of transmitting circuits 711 each are capable of detecting a local temperature by the temperature sensor circuit 300, compensating properties of the amplifier 712 and the multiplexer 713, and contributing to a power consumption reduction.

Since the integrated circuit 700 is high in power consumption and its circuit characteristic is influenced by a temperature change, a large number of the temperature sensor circuits 300 with a small area have to be provided therein in order to measure the local temperature. The temperature sensor circuit 300 can be reduced in size and cost by the CMOS process as described in the first to fourth embodiments.

Note that the above-described embodiments all only illustrate concrete examples in carrying out the present invention, and the technical scope of the present invention should not be construed in a limited manner by these. That is, the present invention may be embodied in various forms without departing from its technical idea or its main features.

Since the voltage twice as high as the threshold voltage is generated by the plural field-effect transistors, it is possible to reduce the area of the temperature sensor circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A temperature sensor circuit comprising:
    an output circuit including a first field-effect transistor configured to output a current proportional to temperature when a voltage twice as high as a threshold voltage is applied to a gate of the first field-effect transistor; and
    a voltage generating circuit configured to generate the voltage twice as high as the threshold voltage by a plurality of field-effect transistors and supply the generated voltage twice as high as the threshold voltage to the gate of the first field-effect transistor.

2. The temperature sensor circuit according to claim 1, wherein transistors in the voltage generating circuit are all field-effect transistors.

3. The temperature sensor circuit according to claim 1, wherein the voltage generating circuit includes:
    a second field-effect transistor having a source connected to a first potential node, and a gate and a drain connected to each other;
    a third field-effect transistor having a source connected to the first potential node, a gate connected to the gate of the second field-effect transistor, and a drain connected to the gate of the first field-effect transistor;
    a fourth field-effect transistor having a source connected to the drain of the second field-effect transistor, and a gate and a drain connected to each other;
    a fifth field-effect transistor having a source connected to the drain of the fourth field-effect transistor, and a gate and a drain connected to a second potential node; and
    a sixth field-effect transistor having a source connected to the drain of the third field-effect transistor, a gate connected to the gate of the fifth field-effect transistor, and a drain connected to a third potential node.

4. The temperature sensor circuit according to claim 3, wherein the voltage generating circuit further includes:
    a seventh field-effect transistor having a drain and a gate connected to a current source, and a source connected to a fourth potential node;
    an eighth field-effect transistor having a drain connected to the drain of the fifth field-effect transistor, a gate connected to the gate of the seventh field-effect transistor, and a source connected to the fourth potential node; and
    a ninth field-effect transistor having a drain and a gate connected to the drain of the sixth field-effect transistor, and a source connected to the fourth potential node.

5. The temperature sensor circuit according to claim 3, wherein a gate width of the sixth field-effect transistor is changeable according to a control signal.

6. The temperature sensor circuit according to claim 5, wherein:
    the sixth field-effect transistor includes a plurality of element transistors provided in parallel between the drain of the third field-effect transistor and the third potential node; and
    the gate width of the sixth field-effect transistor is changed by changing the number of element transistors, out of the plural element transistors, whose gates are connected to the gate of the fifth field-effect transistor, according to the control signal.

7. The temperature sensor circuit according to claim 1, wherein the voltage generating circuit includes:
    a second field-effect transistor having a source connected to a first potential node, and a gate and a drain connected to each other;
    a third field-effect transistor having a source connected to the first potential node, and a gate connected to the gate of the second field-effect transistor;
    a fourth field-effect transistor having a source connected to the drain of the second field-effect transistor, and a gate and a drain connected to a second potential node;
    a fifth field-effect transistor having a source connected to a drain of the third field-effect transistor, a gate connected to the gate of the fourth field-effect transistor, and a drain connected to a third potential node; and
    an amplifier circuit configured to supply a voltage twice as high as a source voltage of the fifth field-effect transistor to the gate of the first field-effect transistor.

8. The temperature sensor circuit according to claim 7, wherein the voltage generating circuit further includes:
    a sixth field-effect transistor having a drain and a gate connected to a current source, and a source connected to a fourth potential node;
    a seventh field-effect transistor having a drain connected to the drain of the fourth field-effect transistor, a gate connected to the gate of the sixth field-effect transistor, and a source connected to the fourth potential node; and
    an eighth field-effect transistor having a drain and a gate connected to the drain of the fifth field-effect transistor, and a source connected to the fourth potential node.

9. The temperature sensor circuit according to claim 7, wherein a gate width of the fifth field-effect transistor is changeable according to a control signal.

10. The temperature sensor circuit according to claim 9, wherein:
    the fifth field-effect transistor includes a plurality of element transistors provided in parallel between the drain of the third field-effect transistor and the third potential node; and
    the gate width of the fifth field-effect transistor is changed by changing the number of element transistors, out of the plural element transistors, whose gates are connected to the gate of the fourth field-effect transistor, according to the control signal.

11. An integrated circuit comprising:
    a temperature sensor circuit configured to output a current proportional to temperature; and
    a processing circuit configured to perform processing according to the current proportional to temperature, wherein the temperature sensor circuit includes:

an output circuit including a first field-effect transistor configured to output the current proportional to temperature when a voltage twice as high as a threshold voltage is applied to a gate of the first field-effect transistor; and a voltage generating circuit configured to generate the voltage twice as high as the threshold voltage by a plurality of field-effect transistors and supply the generated voltage twice as high as the threshold voltage to the gate of the first field-effect transistor.

12. The integrated circuit according to claim 11, wherein transistors in the voltage generating circuit are all field-effect transistors.

13. The integrated circuit according to claim 11, wherein the voltage generating circuit includes:

a second field-effect transistor having a source connected to a first potential node, and a gate and a drain connected to each other;

a third field-effect transistor having a source connected to the first potential node, a gate connected to the gate of the second field-effect transistor, and a drain connected to the gate of the first field-effect transistor;

a fourth field-effect transistor having a source connected to the drain of the second field-effect transistor, and a gate and a drain connected to each other;

a fifth field-effect transistor having a source connected to the drain of the fourth field-effect transistor, and a gate and a drain connected to a second potential node; and a sixth field-effect transistor having a source connected to the drain of the third field-effect transistor, a gate connected to the gate of the fifth field-effect transistor, and a drain connected to a third potential node.

14. The integrated circuit according to claim 13, wherein the voltage generating circuit further includes:

a seventh field-effect transistor having a drain and a gate connected to a current source, and a source connected to a fourth potential node;

an eighth field-effect transistor having a drain connected to the drain of the fifth field-effect transistor, a gate connected to the gate of the seventh field-effect transistor, and a source connected to the fourth potential node; and a ninth field-effect transistor having a drain and a gate connected to the drain of the sixth field-effect transistor, and a source connected to the fourth potential node.

15. The integrated circuit according to claim 13, wherein a gate width of the sixth field-effect transistor is changeable according to a control signal.

16. The integrated circuit according to claim 15, wherein:

the sixth field-effect transistor includes a plurality of element transistors provided in parallel between the drain of the third field-effect transistor and the third potential node; and the gate width of the sixth field-effect transistor is changed by changing the number of element transistors, out of the plural element transistors, whose gates are connected to the gate of the fifth field-effect transistor, according to the control signal.

17. The integrated circuit according to claim 11, wherein the voltage generating circuit includes:

a second field-effect transistor having a source connected to a first potential node, and a gate and a drain connected to each other;

a third field-effect transistor having a source connected to the first potential node, and a gate connected to the gate of the second field-effect transistor;

a fourth field-effect transistor having a source connected to the drain of the second field-effect transistor, and a gate and a drain connected to a second potential node;

a fifth field-effect transistor having a source connected to a drain of the third field-effect transistor, a gate connected to the gate of the fourth field-effect transistor, and a drain connected to a third potential node; and an amplifier circuit configured to supply a voltage twice as high as a source voltage of the fifth field-effect transistor to the gate of the first field-effect transistor.

18. The integrated circuit according to claim 17, wherein the voltage generating circuit further includes:

a sixth field-effect transistor having a drain and a gate connected to a current source, and a source connected to a fourth potential node;

a seventh field-effect transistor having a drain connected to the drain of the fourth field-effect transistor, a gate connected to the gate of the sixth field-effect transistor, and a source connected to the fourth potential node; and an eighth field-effect transistor having a drain and a gate connected to the drain of the fifth field-effect transistor, and a source connected to the fourth potential node.

19. The integrated circuit according to claim 17, wherein a gate width of the fifth field-effect transistor is changeable according to a control signal.

20. The integrated circuit according to claim 19, wherein:

the fifth field-effect transistor includes a plurality of element transistors provided in parallel between the drain of the third field-effect transistor and the third potential node; and the gate width of the fifth field-effect transistor is changed by changing the number of element transistors, out of the plural element transistors, whose gates are connected to the gate of the fourth field-effect transistor, according to the control signal.

21. The integrated circuit according to claim 11, wherein the processing circuit is a parallel-serial converter configured to convert a parallel signal to a serial signal or a serial parallel converter configured to convert a serial signal to a parallel signal.

* * * * *